US008114735B2

(12) United States Patent
Kim et al.

(10) Patent No.: US 8,114,735 B2
(45) Date of Patent: Feb. 14, 2012

(54) METHOD OF MANUFACTURING A NON-VOLATILE MEMORY DEVICE

(75) Inventors: Hong-Suk Kim, Yongin-si (KR);
Si-Young Choi, Seongnam-si (KR);
Ki-Hyun Hwang, Seongnam-si (KR);
Han-Mei Choi, Seoul (KR);
Seung-Hwan Lee, Suwon-si (KR);
Seung-Jae Baik, Seoul (KR); Sun-Jung Kim, Suwon-si (KR); Kwang-Min Park, Seoul (KR); In-Sun Yi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 292 days.

(21) Appl. No.: 11/902,209

(22) Filed: Sep. 20, 2007

(65) Prior Publication Data
US 2008/0070368 A1    Mar. 20, 2008

(30) Foreign Application Priority Data

Sep. 20, 2006  (KR) .................. 10-2006-0091063
Jul. 24, 2007  (KR) .................. 10-2007-0073856

(51) Int. Cl.
*H01L 21/336*    (2006.01)

(52) U.S. Cl. ........ 438/257; 438/261; 438/264; 438/287; 257/E21.422

(58) Field of Classification Search .................. 438/287, 438/257, 261, 264; 257/E21.422
See application file for complete search history.

(56) References Cited

U.S. PATENT DOCUMENTS

| 6,417,570 | B1 * | 7/2002 | Ma et al. ................. 257/760 |
| 6,620,705 | B1 * | 9/2003 | Ogle et al. ................ 438/431 |
| 6,818,558 | B1 * | 11/2004 | Rathor et al. ............. 438/694 |
| 6,955,965 | B1 * | 10/2005 | Halliyal et al. ........... 438/257 |
| 7,592,666 | B2 * | 9/2009 | Noguchi et al. ........... 257/324 |
| 2006/0234467 | A1 * | 10/2006 | Van Gompel et al. ....... 438/424 |

FOREIGN PATENT DOCUMENTS

| JP | 08-088286 | 4/1996 |
| JP | 2001-189390 | 7/2001 |
| KR | 1020050064671 | 6/2005 |
| KR | 1020050076429 | 7/2005 |
| KR | 1020060124001 | 12/2006 |

OTHER PUBLICATIONS

Machine English Translation of JP-2001-189390 of Hiroshi, Publication dated Jul. 10, 2001.*

* cited by examiner

*Primary Examiner* — Michael Trinh
(74) *Attorney, Agent, or Firm* — Harness, Dickey & Pierce, P.L.C.

(57) ABSTRACT

In a method of manufacturing a non-volatile memory device, a tunnel insulating layer may be formed on a channel region of a substrate. A charge trapping layer including silicon nitride may be formed on the tunnel insulating layer to trap electrons from the channel region. A heat treatment may be performed using a first gas including nitrogen and a second gas including oxygen to remove defect sites in the charge trapping layer and to densify the charge trapping layer. A blocking layer may be formed on the heat-treated charge trapping layer, and a conductive layer may then formed on the blocking layer. The blocking layer, the conductive layer, the heat-treated charge trapping layer and the tunnel insulating layer may be patterned to form a gate structure on the channel region. Accordingly, data retention performance and/or reliability of a non-volatile memory device including the gate structure may be improved.

15 Claims, 6 Drawing Sheets

METHOD OF MANUFACTURING A NON-VOLATILE MEMORY DEVICE

This application claims the benefit of priority under 35 USC §119 to Korean Patent Applications No. 2006-91063 filed on Sep. 20, 2006 and No. 2007-73856 filed on Jul. 24, 2007, in the Korean Intellectual Property Office, the contents of which are incorporated herein by reference in their entirety.

BACKGROUND

Semiconductor memory devices, in general, may be classified as either volatile or non-volatile semiconductor memory devices. Volatile semiconductor memory devices, such as dynamic random access memory (DRAM) devices and/or static random access memory (SRAM) devices, may have a relatively high response speed. However, volatile semiconductor memory devices may lose stored data when power is shut off. Although non-volatile semiconductor memory devices, such as electrically erasable programmable read only memory (EEPROM) devices and/or flash memory devices, may have a relatively slow response speed, non-volatile semiconductor memory devices may enable data to not be lost when power is shut off.

In EEPROM devices, data may be electrically stored, e.g., programmed and/or erased through a Fowler-Nordheim (F-N) tunneling mechanism and/or a channel hot electron injection mechanism, for example. A flash memory device may be classified as either a floating gate type or a charge trip type, such as silicon-oxide-nitride-oxide-semiconductor (SONOS) type devices and/or metal-oxide-nitride-oxide-semiconductor (MONOS) type devices.

SONOS and MONOS type non-volatile memory devices may include a tunnel insulating layer formed on a channel region of a semiconductor substrate, a charge trapping layer for trapping electrons from the channel region, a blocking layer formed on the charge trapping layer, a gate electrode formed on the blocking layer, spacers formed on side surfaces of the gate electrode and source/drain regions formed at surface portions of the semiconductor substrate adjacent to the channel region, for example.

A silicon nitride layer may be used as the charge trapping layer. However, defect sites, such as silicon dangling bonds, silicon hydrogen (Si—H) bonds, etc, may be present in the silicon nitride layer and may cause lateral charge diffusion. As a result, data retention performance and/or reliability of the non-volatile memory device may be deteriorated.

A conventional non-volatile memory device may serve a single level cell (SLC) or a multi-level cell (MLC), and electrically perform programming and/or erasing operations using the F-N tunneling mechanism and/or the channel hot electron injection mechanism, for example.

When a conventional non-volatile memory device is used as the SLC, a logic stage of "0" or "1" may be stored in the charge trapping layer.

When a conventional non-volatile memory device is used as the MLC, a logic stage of "00," "01," "10" or "11" may be stored in the charge trapping layer.

When a conventional non-volatile memory device is used as the MLC, a relatively high thermal and/or electrical stress may be applied to a conventional non-volatile memory device compared to when a conventional non-volatile memory device is used as the SLC. Thus, when a conventional non-volatile memory device is used as the MLC, a threshold voltage window of about 6.0V may need to be applied.

To increase a threshold voltage window of a conventional non-volatile memory device, a metal oxide layer having a dielectric constant higher than that of silicon nitride may be used as the blocking layer. For example, an aluminum oxide layer may be used as the blocking layer.

However, an unwanted material layer may be formed between a silicon nitride layer used as the charge trapping layer and the aluminum oxide layer while forming the aluminum oxide layer. For example, an aluminum silicon oxynitride layer may be formed between the silicon nitride layer and the aluminum oxide layer. Thus, the threshold voltage window of the non-volatile memory device may be decreased by the aluminum silicon oxynitride layer. For example, while performing a programming and/or erasing operation of the non-volatile memory device, an electric field applied to the tunnel insulating layer may be decreased by the aluminum silicon oxynitride layer. Thus, the threshold voltage window may be decreased. As a result, the reliability of a non-volatile memory device may be deteriorated.

SUMMARY OF EXAMPLE EMBODIMENTS

Example embodiments may provide a method of manufacturing a non-volatile memory device that may improve data retention performance and/or reliability.

In example embodiments, a method of manufacturing a non-volatile memory device may include forming a tunnel insulating layer on a channel region of a substrate, and forming a charge trapping layer including silicon nitride on the tunnel insulating layer to trap electrons from the channel region. A heat treatment may be performed using a first gas, including nitrogen, and a second gas, including oxygen, to remove defect sites in the charge trapping layer and/or to densify the charge trapping layer. A blocking layer may be formed on the heat-treated charge trapping layer, and a conductive layer may be formed on the blocking layer. A gate structure may be formed on the channel region of the substrate by patterning the conductive layer, the blocking layer, the heat-treated charge trapping layer and/or the tunnel insulating layer.

In example embodiments, the charge trapping layer may be heat-treated at a temperature of about 900° C. to about 1250° C. and at a temperature of about 1150° C. to about 1250° C.

In example embodiments, the blocking layer may include a metal oxide having a dielectric constant higher than that of silicon nitride. For example, a metal that may be used for the metal oxide may include hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Th), dysprosium (Dy), holmium (Ho), erbium (Er), thulium (Tm), ytterbium (Yb), lutetium (Lu), etc. These metals may be used alone or in a combination thereof.

In example embodiments, the blocking layer may include metal silicon oxide.

In example embodiments, the first gas may include nitrogen ($N_2$), ammonia ($NH_3$), etc. A gas mixture of nitrogen and ammonia may also be used as the first gas. Examples of the second gas may include oxygen ($O_2$), ozone ($O_3$), nitrogen monoxide (NO), etc. These gases may be used alone or in combination.

In example embodiments, the charge trapping layer may be heat-treated using a gas mixture of the first gas and the second gas.

The gas mixture may include about 90 to about 99 percent by volume of nitrogen and/or about 1 to about 10 percent by volume of nitrogen monoxide.
}

In example embodiments, the gas mixture may include about 95 to about 98 percent by volume of nitrogen and/or about 2 to about 5 percent by volume of nitrogen monoxide.

In example embodiments, the gas mixture may include about 95 to about 99 percent by volume of nitrogen and/or about 1 to about 5 percent by volume of oxygen.

In example embodiments, the gas mixture may include about 97 to about 99 percent by volume of nitrogen and/or about 1 to about 3 percent by volume of ozone.

In example embodiments, a first heat treatment using the first gas and a second heat treatment using the second gas may be sequentially performed.

In example embodiments, a densified silicon oxynitride layer may be formed at a surface portion of the charge trapping layer by heat-treating the charge trapping layer.

In example embodiments, the conductive layer may be patterned to form a gate electrode structure. The blocking layer, the heat-treated charge trapping layer and the tunnel insulating layer may be patterned to form a blocking layer pattern, a charge trapping layer pattern and a tunnel insulating layer pattern. As a result, the gate structure may be formed on the substrate, which may include the gate electrode structure, the blocking layer pattern, the charge trapping layer pattern and the tunnel insulating layer pattern.

In example embodiments, spacers may be formed on side surfaces of the gate electrode structure. The blocking layer, and the heat-treated charge trapping layer and the tunnel insulating layer may be patterned by an etching process using the spacers as an etch mask.

In example embodiments, source/drain regions may be formed at surface portions of the substrate adjacent to the gate structure after forming the gate structure.

In an example method of manufacturing a non-volatile memory device, a tunnel insulating layer may be formed on a channel region of a substrate, and a charge trapping layer including silicon nitride may be formed on the tunnel insulating layer to trap electrons from the channel region. A heat treatment may be performed at a temperature of about 1000° C. to about 1250° C. to densify the charge trapping layer. A blocking layer may be formed on the heat-treated charge trapping layer, and a conductive layer may be formed on the blocking layer. A gate structure may be formed on the channel region of the substrate by patterning the conductive layer, the blocking layer, the heat-treated charge trapping layer and the tunnel insulating layer.

In example embodiments, the blocking layer may include silicon oxide or metal oxide having a dielectric constant higher than that of silicon nitride.

The blocking layer may also include metal silicon oxide.

In example embodiments, the charge trapping layer may be heat-treated under a gas atmosphere including nitrogen.

The charge trapping layer may also be heat-treated under an inert gas atmosphere.

In example embodiments, the charge trapping layer may be heat-treated under a gas atmosphere having a partial pressure of oxygen in a range of about $1 \times 10^{-6}$ Torr to about $1 \times 10^{-4}$ Torr.

The charge trapping layer may also be heat-treated under a gas atmosphere having a partial pressure of oxygen less than about $1 \times 10^{-6}$ Torr.

In example embodiments, the charge trapping layer may be heat-treated at a temperature of about 1150° C. to about 1250° C.

In accordance with example embodiments, the defects in the charge trapping layer may be sufficiently removed by the heat treatment and/or the charge trapping layer may be sufficiently densified by the heat treatment. Accordingly, an unwanted material layer may be prevented from being formed on the charge trapping layer while forming the blocking layer and data retention performance and/or reliability of the non-volatile memory device may be improved.

BRIEF DESCRIPTION OF THE DRAWINGS

Example embodiments will become readily apparent along with the following detailed description when considered in conjunction with the accompanying drawings, wherein.

DESCRIPTION OF THE EXAMPLE EMBODIMENTS

Figure 1:
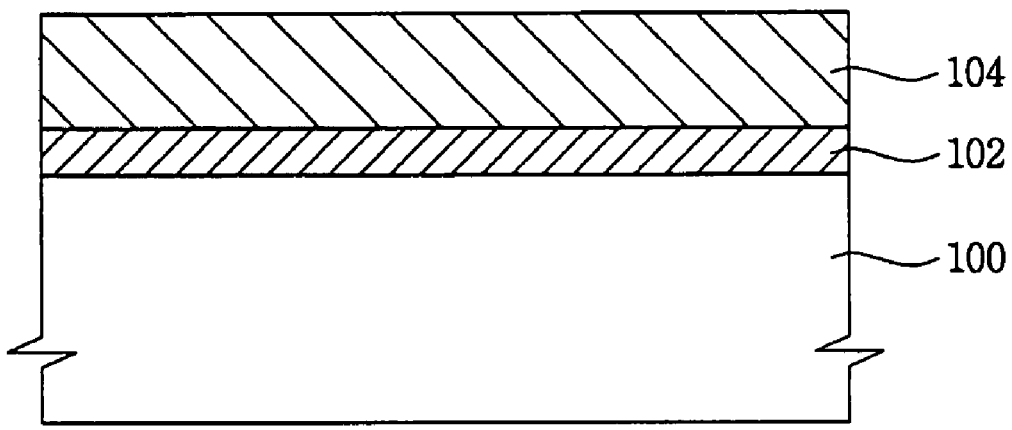
FIGS. 1 to 7 are cross-sectional views illustrating an example method of manufacturing a non-volatile memory device according to an example embodiment.

Example embodiments will be described more fully hereinafter with reference to the accompanying drawings, in which example embodiments are shown. However, example embodiments may be embodied in many different forms and should not be construed as limited to the example embodiments set forth herein. Rather, these example embodiments are provided so that this disclosure will be thorough and complete, and will fully convey the scope of the example embodiments to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the example embodiments.

FIGS. 1 to 7 are cross-sectional views illustrating a method of manufacturing a non-volatile memory device in accordance with example embodiments.

Figure 2:
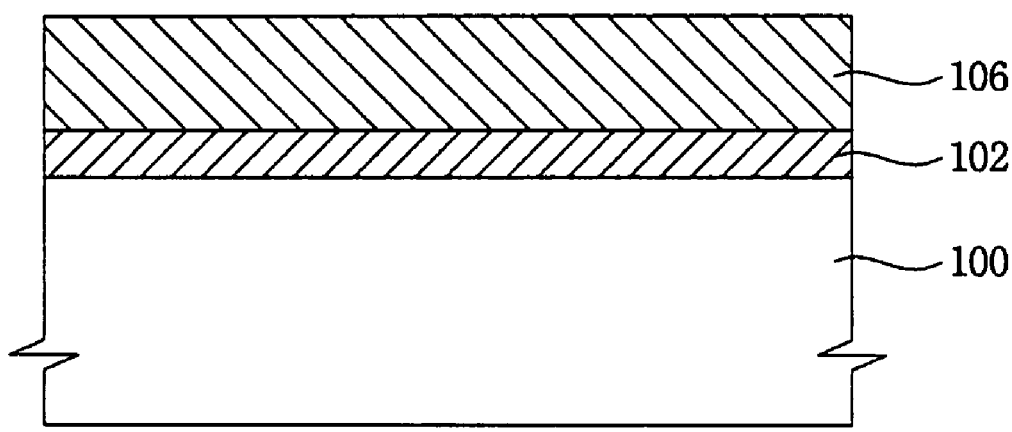
Figure 3:
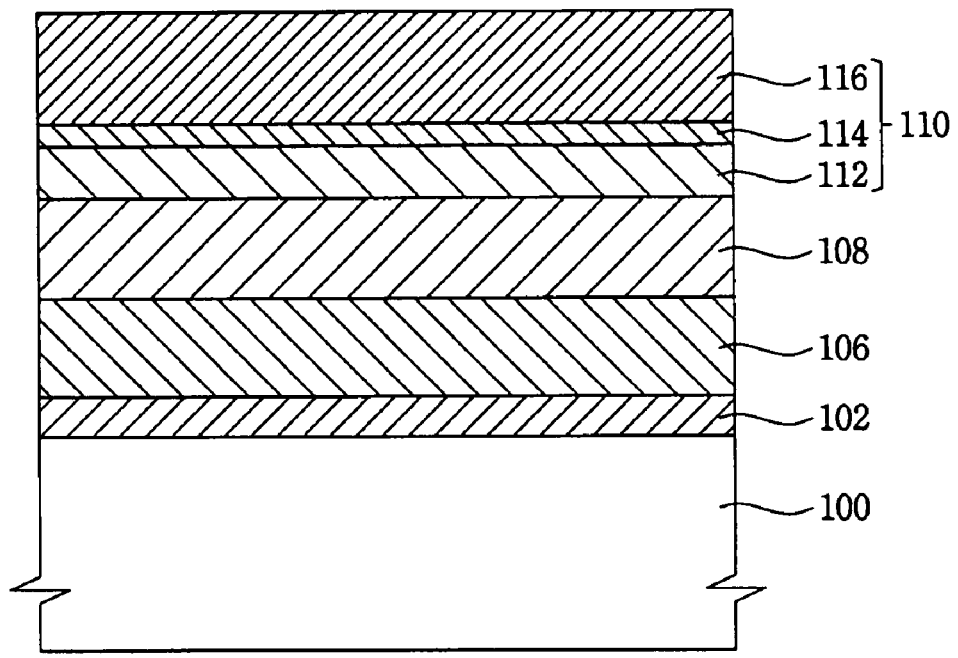

Referring to FIGS. 1-3, an isolation layer (not shown) may be formed to define an active region in a surface portion of a semiconductor substrate 100 such as a silicon wafer. For example, the isolation layer may be formed in the surface portion of the semiconductor substrate 100 by a local oxidation of silicon (LOCOS) or a shallow trench isolation (STI) process.

A tunnel insulating layer 102, a charge trapping layer 104, a blocking layer 108 and a conductive layer 110 may be formed sequentially on the semiconductor substrate 100.

Referring to FIG. 1, the tunnel insulating layer 102 may include silicon oxide ($SiO_2$), and may be formed by a thermal oxidation process. The tunnel insulating layer 102 may be formed to a thickness of about 30 Å to about 100 Å by a thermal oxidation process. For example, the tunnel insulating layer 102 may be formed to a thickness of about 40 Å on the semiconductor substrate 100.

The charge trapping layer 104 may be formed to trap electrons from a channel region of the semiconductor substrate 100. The charge trapping layer 104 may include silicon nitride ($Si_3N_4$), for example.

The charge trapping layer 104 may be formed to a thickness of about 20 Å to about 100 Å by a low pressure chemical vapor deposition (LPCVD) process. For example, the charge trapping layer 104 may be formed to a thickness of about 60 Å on the tunnel insulating layer 102.

Referring to FIG. 2, after forming the charge trapping layer 104, a heat treatment may be performed at a temperature of about 900° C. to about 1250° C. to densify the charge trapping layer 104. The heat treatment may be performed to densify the charge trapping layer 104 to thereby prevent an unwanted material layer, e.g., a metal silicon oxynitride layer, from being formed on the charge trapping layer 104 while subsequently forming the blocking layer 108 in FIG. 3. For example, the charge trapping layer 104 may be heat-treated at a temperature of about 1150° C. to about 1250° C. to enhance the heat treatment efficiency.

The heat treatment may be performed to remove defect sites in the charge trapping layer 104. The defect sites, such as silicon dangling bonds, silicon hydrogen (Si—H) bonds, etc, may be present in the charge trapping layer 104, which may deteriorate electrical characteristics of the charge trapping layer 104. For example, the defect sites may cause lateral charge diffusion in the charge trapping layer 104. Thus, data retention performance and/or reliability of a non-volatile memory device including the charge trapping layer 104 may be deteriorated.

The heat treatment may be performed using a gas mixture of a first gas, including nitrogen, and a second gas, including oxygen, to remove the defect sites. While performing the heat treatment, the Si—H bonds in the charge trapping layer 104 may be substituted with silicon oxygen (Si—O) bonds, and silicon dangling bonds may be removed. As a result, a densified silicon oxynitride (SiON) layer (not shown) may be formed at a surface portion of the charge trapping layer 104.

Further, a concentration of nitrogen at an interface portion between the tunnel insulating layer 102 and the substrate 100 may be increased by the heat treatment. Thus, a dielectric constant of the tunnel insulating layer 102 may be increased, and a leakage current through the tunnel insulating layer 102 may be decreased. As a result, reliability of the non-volatile memory device may be improved.

Examples of the first gas may include nitrogen ($N_2$), ammonia ($NH_3$), etc. A gas mixture of nitrogen and ammonia may also be used as the first gas. Examples of the second gas may include nitrogen monoxide (NO), oxygen (O2), ozone (O3), etc. The second gases may be used alone or in combination. The gas mixture of the first and second gases may be provided at a flow rate of about 0.5 to about 1.0 l/min.

For example, the heat treatment may be performed using a gas mixture of nitrogen and nitrogen monoxide. The gas mixture may include about 90 to about 99 percent by volume of nitrogen and about 1 to about 10 percent by volume of nitrogen monoxide. In example embodiments, the gas mixture may include about 95 to 98 percent by volume of nitrogen and about 2 to about 5 percent by volume of nitrogen monoxide.

Nitrous oxide ($N_2O$) may also be used as the second gas. However, because nitrous oxide has an oxidizing power greater than that of nitrogen monoxide, it may not desirable to use $N_2O$ as the second gas.

According to example embodiments, the gas mixture may include about 95 to 99 percent by volume of nitrogen and about 1 to about 5 percent by volume of oxygen.

According example embodiments, the gas mixture may also include about 97 to 99 percent by volume of nitrogen and about 1 to about 3 percent by volume of ozone.

According to example embodiments, the charge trapping layer 104 may be densified by a first heat treatment and/or a second heat treatment. For example, the first heat treatment may be performed using the first gas, and second heat treatment may then be performed using the second gas. Particularly, the second heat treatment may be performed by a rapid thermal process (RTP) apparatus using oxygen or ozone. For example, the second heat treatment may be performed under an oxygen gas atmosphere for about 1 to about 5 minutes using the RTP apparatus. Alternatively, the second heat treatment may be performed under an ozone gas atmosphere for about 1 to about 3 minutes using the RTP apparatus.

According to example embodiments, the heat treatment may be performed at a temperature of about 1000° C. to about 1250° C. using only the first gas. The heat treatment may also be performed at a temperature of about 1150° C. to about 1250° C. to densify the charge trapping layer 104. For example, the heat treatment may be performed under a nitrogen gas atmosphere at a temperature of about 1200° C.

According to example embodiments, the heat treatment may be performed under an inert gas atmosphere including argon (Ar) or helium (He).

The heat treatment may be performed under a gas atmosphere having a partial pressure of oxygen less than about $1 \times 10^{-4}$ Torr to prevent surface portions of the charge trapping layer 104 from oxidizing while performing the heat treatment using the first gas. For example, the partial pressure of oxygen may be in a range of about $1 \times 10^{-6}$ Torr to about $1 \times 10^{-4}$ Torr. Particularly, the partial pressure of oxygen may be less than about $1 \times 10^{-6}$ Torr.

The heat treatment using the first gas may be performed to densify the charge trapping layer 104 and/or to remove defect sites in the charge trapping layer 104 to form the heat treated charge trapping layer 106.

Referring to FIG. 3, the blocking layer 108 may be formed on the heat-treated charge trapping layer 106. The blocking layer 108 may be formed to electrically isolate the charge trapping layer 106 from the conductive layer 110. The blocking layer 108 may include silicon oxide, silicon oxynitride or a high-k material, such as metal oxide having a dielectric constant higher than that of silicon nitride, and may be formed by a chemical vapor deposition (CVD) process or an atomic layer deposition (ALD) process. For example, the blocking layer 108 may include aluminum oxide ($Al_2O_3$), and may be formed to a thickness of about 100 Å to about 400 Å on the charge trapping layer 106. In example embodiments, the blocking layer 108 may be formed to a thickness of about 200 Å on the charge trapping layer 106.

Examples of a metal that may be used for the metal oxide may include hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Th), dysprosium (Dy), holmium (Ho), erbium (Er), thulium (Tm), ytterbium (Yb), lutetium (Lu), and the like. These metals may be used alone or in combination. Examples of the blocking layer 108 may include hafnium aluminum oxide (HfAlO), lanthanum oxide ($La_2O_3$), aluminum lanthanum oxide (AlLaO), hafnium lanthanum oxide (HfLaO), and the like. These metal oxides may be used alone or in combination.

According to example embodiments, the blocking layer 108 may include metal oxynitride, metal silicon oxide or metal silicon oxynitride. Examples of a metal that may be used for the blocking layer 108 may include hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Th), dysprosium (Dy), holmium (Ho), erbium (Er), thulium (Tm), ytterbium (Yb), lutetium (Lu), and the like. These metals may be used alone or in combination.

Because the charge trapping layer 106 may be sufficiently densified by the heat treatment, an unwanted material layer including by-products, such as metal silicon oxynitride, may not be formed on the charge trapping layer 106 while forming the blocking layer 108. For example, an oxidation reaction between a metal precursor and an oxidizing agent supplied to form the blocking layer 108 and a surface portion of the charge trapping layer 106 may be sufficiently suppressed. Thus, the unwanted metal silicon oxynitride layer, such as an aluminum silicon oxynitride layer, may be prevented from being formed on the charge trapping layer 106.

An example method of forming an aluminum oxide layer to be used as the blocking layer 108 on the heat-treated charge trapping layer 106 will be described hereinafter.

The semiconductor substrate 100 on which the charge trapping layer 106 is formed, may be placed in a chamber for an ALD process. An interior of the chamber may be maintained at a temperature of about 150° C. to about 400° C. and a pressure of about 0.1 Torr to about 3.0 Torr. For example, the interior of the chamber may be maintained at a temperature of about 300° C. and a pressure of about 1.0 Torr.

A first reactive material, including an aluminum precursor, may be supplied onto the charge trapping layer 106 to form an aluminum precursor layer. A gaseous aluminum precursor may be used as the first reactive material, and the gaseous aluminum precursor may be carried by a carrier gas, such as argon (Ar), nitrogen ($N_2$), and the like. The gaseous aluminum precursor may be provided by a liquid delivery system (LDS) or a bubbler system.

Examples of an aluminum precursor may include, trimethyl aluminum (TMA; $Al(CH_3)_3$), triethyl aluminum (TEA; $Al(C_2H_5)_3$), and the like. These aluminum precursors may be used alone or in combination. The first reactive material may be supplied onto the semiconductor substrate 100 for about 0.5 to about 3 seconds. For example, the first reactive material may be supplied onto the semiconductor substrate 100 for about 2 seconds.

A portion of the first reactive material, which is supplied onto the semiconductor substrate 100, may be chemisorbed onto the charge trapping layer 106 to form the aluminum precursor layer. A remaining portion of the first reactive material may be physisorbed onto the aluminum precursor layer and/or may drift in the chamber.

After forming the aluminum precursor layer, a purge gas may be supplied into the chamber, and the chamber may be simultaneously evacuated. The purge gas may include nitrogen ($N_2$) or argon (Ar), and may be supplied for about 0.5 to about 5 seconds. For example, the purge gas may be supplied for about 2 seconds.

The remaining portion of the first reactive material, which may be physisorbed onto the aluminum precursor layer and/or drifts in the chamber, may be removed from the chamber along with the purge gas supplied into the chamber.

After purging the chamber, a second reactive material, including oxygen, may be supplied onto the semiconductor substrate 100 to oxidize the aluminum precursor layer so that the blocking layer 108, including aluminum oxide, may be formed on the charge trapping layer 106.

Examples of the second reactive material may include, ozone ($O_3$), oxygen ($O_2$), water vapor ($H_2O$), oxygen plasma, and the like. These reactive materials may be used alone or in combination. For example, an ozone gas may be supplied onto the aluminum precursor layer for about 1 to about 5 seconds. In example embodiments, the ozone gas may be supplied onto the aluminum precursor layer for about 3 seconds.

Because the charge trapping layer 106 may be sufficiently densified by the heat treatment, a reaction between the aluminum precursor layer, the second reactive material and the charge trapping layer 106 may be sufficiently suppressed while supplying the second reactive material. As a result, an unwanted material layer, e.g., an aluminum silicon oxynitride layer, may be prevented from being formed between the charge trapping layer 106 and the blocking layer 108.

After forming the blocking layer 108, a purge gas may be supplied into the chamber, and the chamber may be simultaneously evacuated. Thus, by-products produced by the oxidation reaction between the aluminum precursor layer and the second reactive material and a remaining portion of the second reactive material may be removed from the chamber. The purge gas may be supplied for about 1 to about 5 seconds. For example, the purge gas may be supplied for about 3 seconds.

The process of forming the blocking layer 108 may be repeatedly performed until the blocking layer 108 has a desired thickness.

The conductive layer 110 may be formed on the blocking layer 108, and include a first conductive layer 112, an adhesion layer 114 and a second conductive layer 116.

The first conductive layer 112 may be formed to a thickness of about 100 Å to about 400 Å on the blocking layer 108. For example, the first conductive layer 112 may be formed to a thickness of about 200 Å by a CVD process, an ALD process or a physical vapor deposition (PVD) process.

The first conductive layer 112 may include a material having a work function equal to or higher than about 4 eV. Examples of a material that may be used for the first conductive layer 112 may include, titanium (Ti), titanium nitride (TiN), tantalum (Ta), tantalum nitride (TaN), tungsten (W), tungsten nitride (WN), hafnium (Hf), niobium (Nb), molybdenum (Mo), molybdenum nitride ($MO_2N$), ruthenium oxide (RuO), ruthenium dioxide ($RuO_2$), iridium (Ir), iridium dioxide ($IrO_2$), platinum (Pt), cobalt (Co), chromium (Cr), titanium aluminide ($Ti_3Al$), titanium aluminum nitride ($Ti_2AlN$), palladium (Pd), tungsten suicide (WSi), nickel silicide (NiSi), cobalt silicide (CoSi), tantalum silicide (TaSi), and the like. These materials may be used alone or in combination.

According to example embodiments, a post treatment may be performed to increase the work function of the first conductive layer 112. For example, a heat treatment, a plasma treatment or an ion implantation may be performed after forming the first conductive layer 112. The post treatment may be performed using a process gas including a material different from that of the first conductive layer 108. In example embodiments, the post treatment may be performed using a process gas including one of the elements corresponding to group II to group VIII of the periodic table. Examples of members of these groups of elements may include, nitrogen (N), oxygen (O), fluorine (F), neon (Ne), helium (He), phosphor (P), sulfur (S), chloride (Cl), argon (Ar), arsenic (As), selenium (Se), bromine (Br), krypton (Kr), antimony (Sb), tellurium (Te), iodine (I), xenon (Xe), and the like.

After forming the first conductive layer 112, the adhesion layer 114 may be formed to a thickness of about 50 Å on the first conductive layer 112. The adhesion layer 114 may include metal nitride. Examples of the metal nitride may include, tungsten nitride, titanium nitride, tantalum nitride, and the like. The metal nitrides may be used alone or in combination.

The second conductive layer 116 may be formed to a thickness of about 300 Å on the adhesion layer 114. The second conductive layer 116 may include tungsten. Alternatively, the second conductive layer 116 may include a metal silicide. Examples of the metal silicide may include, tungsten silicide, tantalum silicide, cobalt silicide, titanium silicide, and the like. The metal suicides may be used alone or in combination.

Figure 4:
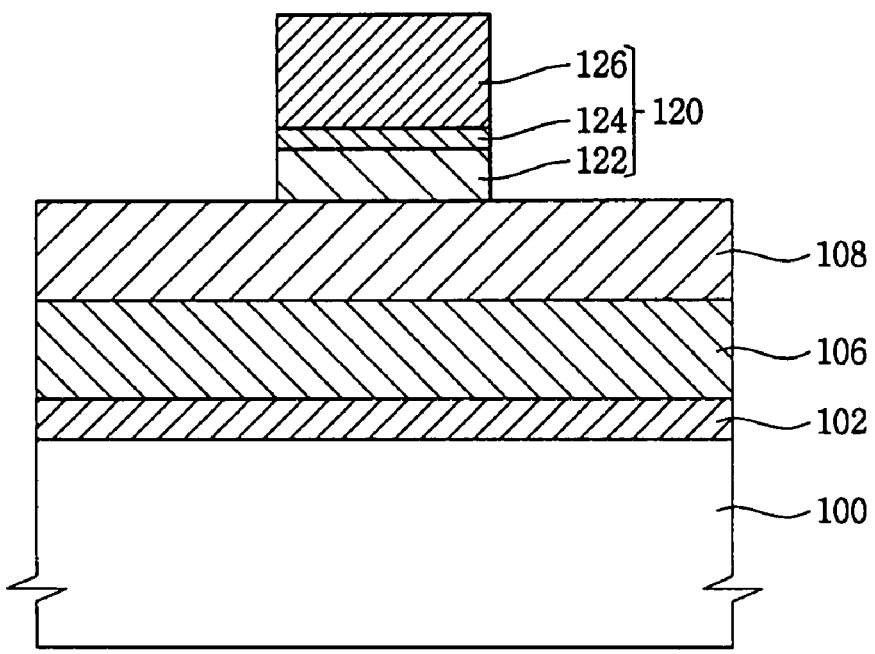

Referring to FIG. 4, a photoresist pattern may be formed on the conductive layer 110. The photoresist pattern may be formed by a photolithography process which is well-known to those skilled in the art.

The conductive layer 110 may be patterned to form a gate electrode structure 120 including, a first conductive layer pattern 122, an adhesion layer pattern 124 and a second conductive layer pattern 126. For example, the gate electrode structure 120 may be formed by an anisotropic etching process using the photoresist pattern as an etching mask. The first conductive layer pattern 122 may serve as a gate electrode and the second conductive layer pattern 126 may serve as a word line.

The photoresist pattern may be removed by an ashing process and/or a stripping process after forming the gate electrode structure 120.

Figure 5:
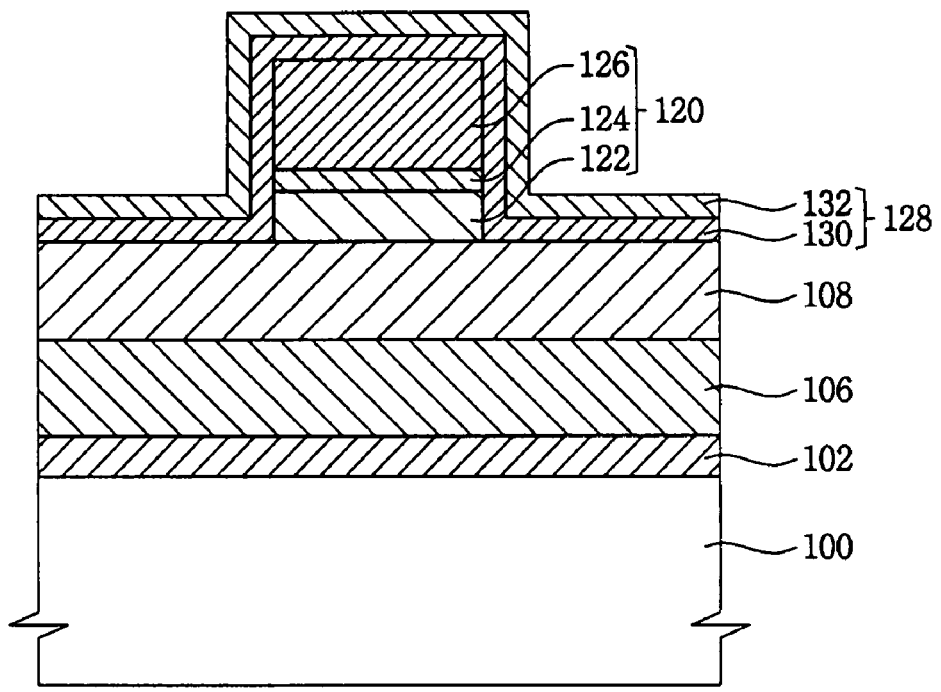

Referring to FIG. 5, a space layer 128 may be formed on the gate electrode structure 120 and the blocking layer 108. The space layer 128 may include a silicon oxide layer 130 and a silicon nitride layer 132. For example, the silicon oxide layer 130 may be formed on the gate electrode structure 120 and the blocking layer 108, and the silicon nitride layer 132 may be then formed on the silicon oxide layer 130. The silicon oxide layer 130 and the silicon nitride layer 132 may be formed by a CVD process, respectively. Alternatively, the silicon oxide layer 130 and the silicon nitride layer 132 may be formed in a chamber by an in-situ process.

Figure 6:
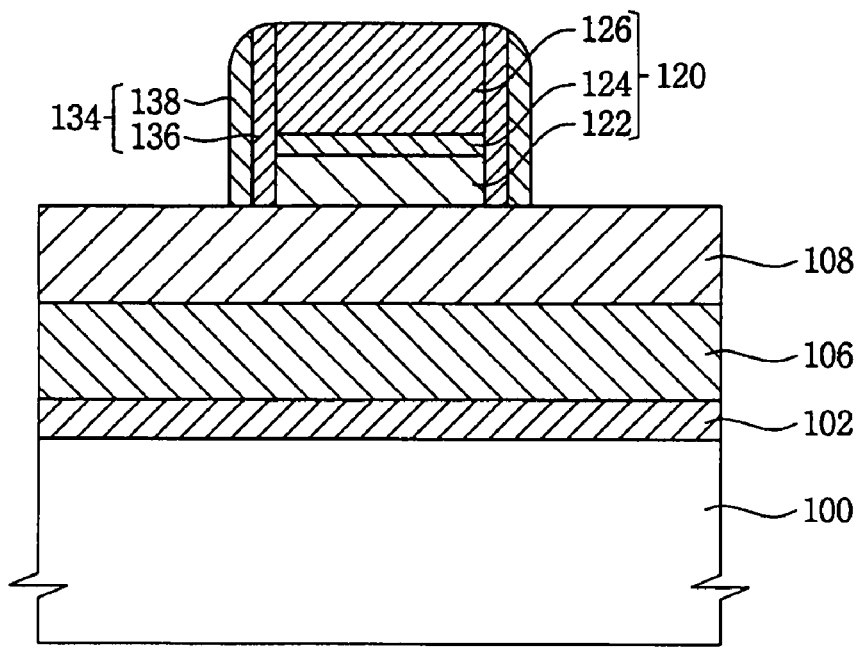

Referring to FIG. 6, a dual spacer 134 may be formed on side surfaces of the gate electrode structure 120 by anisotropically etching the spacer layer 128, for example. The dual spacer 134 may include a silicon oxide spacer 136 and a silicon nitride spacer 138.

According to example embodiments, a spacer having a single layered structure may be formed on the side surfaces of the gate electrode structure 120. The spacer may be a silicon oxide spacer or a silicon nitride spacer.

Figure 7:
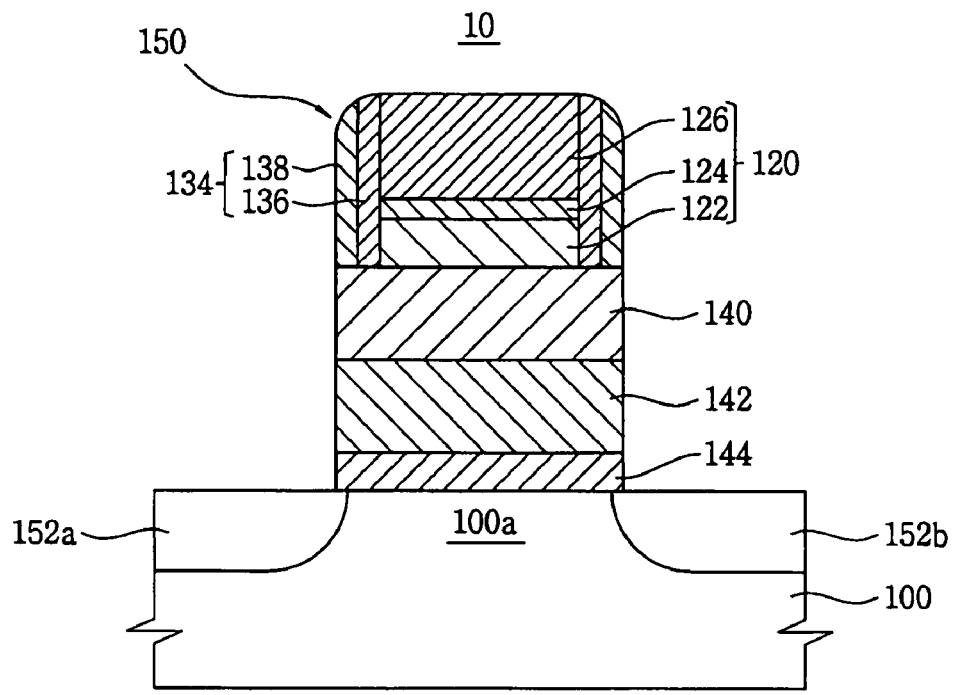

Referring to FIG. 7, a blocking layer pattern 140, a charge trapping layer pattern 142 and a tunnel insulating layer pattern 144 may be formed by anisotropically etching the blocking layer 108, the charge trapping layer 106 and the tunnel insulating layer 102 using the gate electrode structure 120 and the dual spacer 134 as etch masks, for example.

As a result, a gate structure 150 may be formed on a channel region 100a of the semiconductor substrate 100, which may include the gate electrode structure 120, the dual spacer 134, the blocking layer pattern 140, the charge trapping layer pattern 142 and the tunnel insulating layer pattern 144.

According to example embodiments, a re-oxidation process may be performed to cure etching damage to the semiconductor substrate 100 and the gate structure 150.

According to example embodiments, a gate structure may be formed by anisotropically and sequentially etching the conductive layer 110, the blocking layer 108, the charge trapping layer 106 and the tunnel insulating layer 102. The gate structure may include a conductive pattern, a blocking layer pattern, a charge trapping layer pattern and the tunnel insulating pattern, and spacers may be formed on side surfaces of the gate structure.

Source/drain regions 152a and 152b may be formed at surface portion of the semiconductor substrate 100 adjacent to the gate structure 150 to form a non-volatile memory device 10 on the semiconductor substrate 100. The source/drain regions 152a and 152b may be formed by an ion implantation process using the gate structure 150 as an ion implantation mask and a heat treatment process, for example.

The non-volatile memory device 10 may be used as an SLC or a MLC, and perform electrically programming and/or erasing operations using the F-N tunneling mechanism and/or the channel hot electron injection mechanism.

When the non-volatile memory device 10 serves as the SLC, one bit of data may be stored in the charge trapping layer pattern 142. For example, a logic state of "0" or "1" (e.g., a binary value of "0" or "1") may be stored in the charge trapping layer pattern 142.

For example, when a programming voltage of about 5V to about 18V is applied to the gate electrode structure 120, electrons may be trapped in the charge trapping layer pattern 142 from the channel region 100a of the semiconductor substrate 100 by the F-N tunneling mechanism. Accordingly, a logic stage of "1" may be stored in the charge trapping layer pattern 142. A threshold voltage in the channel region 100a may vary in accordance with the logic state stored in the charge trapping layer pattern 142, and the logic state may be read by applying reading voltages to gate electrode structure 120 and the drain region 152b and detecting a current in the channel region 100a.

When the non-volatile memory device 10 serves as the MLC, a logic stage of "00," "01," "10" or "11" may be stored in the charge trapping layer pattern 142.

For example, the non-volatile memory device 10 may have threshold voltages different from one another in accordance with the number of electrons trapped in the charge trapping layer pattern 142, and the logic state of the non-volatile memory device 10 may be determined in accordance with the threshold voltages.

Alternatively, electrons may be trapped in the charge trapping layer pattern 142 by a channel hot electron injection mechanism. For example, when programming voltages are applied to the gate electrode 120 and the drain region 152b, and the source region 152a is grounded, electrons may move from the source region 152a toward the drain region 152b through the channel region 100a. Some of the electrons may have sufficient energy to overcome the potential barrier of the tunnel insulating layer pattern 144, and be trapped in trap sites of the charge trapping layer pattern 142. As a result, the threshold voltage of the non-volatile memory device 10 may be increased and one bit of data may be stored in the non-volatile memory device 10.

Analysis of Charge Trapping Layer

A silicon oxide layer to be used as a first tunnel insulating layer was formed to a thickness of about 40 Å on a semiconductor substrate according to a conventional method. Then, a silicon nitride layer to be used as a first charge trapping layer was formed to a thickness of about 70 Å on the first tunnel insulating layer.

A silicon oxide layer to be used as a second tunnel insulating layer was formed to a thickness of about 40 Å on a semiconductor substrate according to example embodiments. Then, a silicon nitride layer to be used as a second charge trapping layer was formed to a thickness of about 70 Å on the second tunnel insulating layer. A heat treatment was performed at a temperature of about 950° C. for about 30 minutes using a gas mixture of about 98 percent by volume of nitrogen and about 2 percent by volume of nitrogen monoxide. A nitrogen gas was supplied at a flow rate of about 0.98 l/min into a chamber in which the heat treatment was performed. A nitrogen monoxide gas was supplied at a flow rate of about 0.02 l/min into the chamber.

A silicon oxide layer to be used as a third tunnel insulating layer was formed to a thickness of about 40 Å on a semiconductor substrate according to example embodiments. Then, a silicon nitride layer to be used as a third charge trapping layer was formed to a thickness of about 70 Å on the third tunnel insulating layer. A heat treatment was performed at a temperature of about 1000° C. for about 30 minutes using a nitrogen gas.

Figure 8:
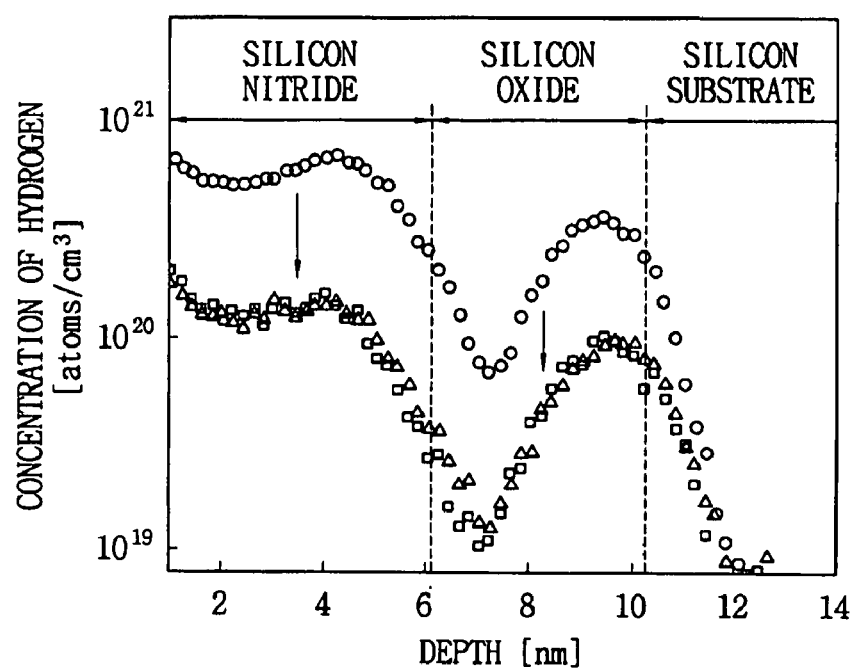
FIG. 8 is an example graph illustrating a concentration of hydrogen in a first tunnel insulating layer and a first charge trapping layer formed by a conventional method and concentrations of hydrogen in second and third tunnel insulating layers and second and third charge trapping layers formed by example embodiments.

FIG. 8 is an example graph illustrating a concentration of hydrogen in a first tunnel insulating layer and a first charge trapping layer formed by a conventional method and concentrations of hydrogen in second and third tunnel insulating layers and second and third charge trapping layers formed by example embodiments.

Concentrations of hydrogen in the first, second and third tunnel insulating layers and the first, second and third charge trapping layers were measured by a secondary ion mass spectrometry (SIMS). As shown in FIG. 8, concentrations of hydrogen in the second and third tunnel insulating layers and the second and third charge trapping layers were remarkably reduced in comparison with the first tunnel insulating layer and the first charge trapping layer. It was understood that Si—H bonds in the second and third tunnel insulating layers and the second and third charge trapping layers were sufficiently removed by the heat treatment using the gas mixture and the heat treatment using the nitrogen gas.

Figure 9:
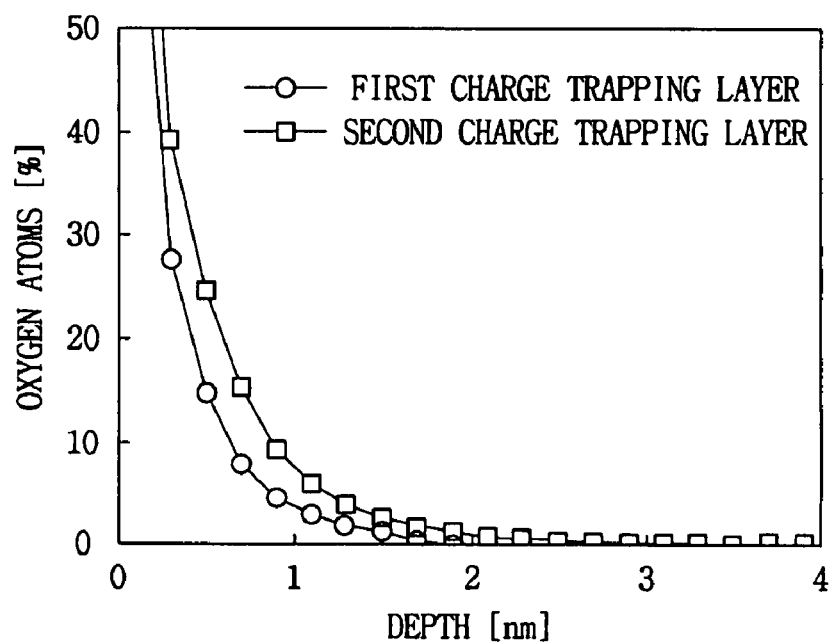
FIG. 9 is an example graph illustrating a concentration of oxygen in a first charge trapping layer formed by a conventional method and a concentration of oxygen in a second charge trapping layer formed by an example embodiment.

FIG. 9 is an example graph illustrating a concentration of oxygen in a first charge trapping layer formed by a conventional method and a concentration of oxygen in a second charge trapping layer formed by an example embodiments.

Concentrations of oxygen in the first and second charge trapping layers were measured by a SIMS. As shown in FIG. 9, a concentration of oxygen in the second charge trapping layers was increased in comparison with the first charge trapping layer. It was understood that silicon dangling bonds in the second charge trapping layer were sufficiently removed by the heat treatment using the gas mixture.

High Temperature Stress Characteristics of Non-Volatile Memory Device

A first non-volatile memory device was manufactured on a semiconductor substrate by a conventional method. The first non-volatile memory device was manufactured to include a silicon oxide layer having a thickness of about 40 Å as a tunnel insulating layer, a silicon nitride layer having a thickness of about 70 Å as a charge trapping layer, an aluminum oxide layer having a thickness of about 200 Å as a blocking layer, a tantalum nitride layer having a thickness of about 200 Å as a gate electrode, a tungsten nitride layer having a thickness of about 50 Å as an adhesion layer or a barrier layer, and a tungsten layer having a thickness of about 300 Å as a word line.

A second non-volatile memory device was manufactured according to example embodiments. The second non-volatile memory device was manufactured to include a silicon oxide layer having a thickness of about 40 Å as a tunnel insulating layer, a silicon nitride layer having a thickness of about 70 Å as a charge trapping layer, an aluminum oxide layer having a thickness of about 200 Å as a blocking layer, a tantalum nitride layer having a thickness of about 200 Å as a gate electrode, a tungsten nitride layer having a thickness of about 50 Å as an adhesion layer or a barrier layer, and a tungsten layer having a thickness of about 300 Å as a word line. In manufacturing the second non-volatile memory device, a heat treatment was performed at a temperature of about 950° C. for about 60 minutes using a gas mixture of about 90 percent by volume of nitrogen and about 10 percent by volume of nitrogen monoxide after forming the silicon nitride layer. The gas mixture was supplied at a flow rate of about 1 l/min into a chamber in which the heat treatment was performed. A nitrogen gas was supplied at a flow rate of about 0.9 l/min, and a nitrogen monoxide gas was supplied at a flow rate of about 0.1 l/min.

A third non-volatile memory device was manufactured according to example embodiments. The third non-volatile memory device was manufactured to include a silicon oxide layer having a thickness of about 40 Å as a tunnel insulating layer, a silicon nitride layer having a thickness of about 70 Å as a charge trapping layer, an aluminum oxide layer having a thickness of about 200 Å as a blocking layer, a tantalum nitride layer having a thickness of about 200 Å as a gate electrode, a tungsten nitride layer having a thickness of about 50 Å as an adhesion layer or a barrier layer, and a tungsten layer having a thickness of about 300 Å as a word line. In manufacturing the third non-volatile memory device, a heat treatment was performed at a temperature of about 950° C. for about 120 minutes using a gas mixture of about 90 percent by volume of nitrogen and about 10 percent by volume of nitrogen monoxide after forming the silicon nitride layer. The gas mixture was supplied at a flow rate of about 1 l/min into a chamber in which the heat treatment was performed. A nitrogen gas was supplied at a flow rate of about 0.9 l/min, and a nitrogen monoxide gas was supplied at a flow rate of about 0.1 l/min.

A fourth non-volatile memory device was manufactured according to example embodiments. In The fourth non-volatile memory device was manufactured to include a silicon oxide layer having a thickness of about 40 Å as a tunnel insulating layer, a silicon nitride layer having a thickness of about 70 Å as a charge trapping layer, an aluminum oxide layer having a thickness of about 200 Å as a blocking layer, a tantalum nitride layer having a thickness of about 200 Å as a gate electrode, a tungsten nitride layer having a thickness of about 50 Å as an adhesion layer or a barrier layer, and a tungsten layer having a thickness of about 300 Å as a word line. In manufacturing the fourth non-volatile memory device, a heat treatment was performed at a temperature of about 950° C. for about 60 minutes using a gas mixture of about 95 percent by volume of nitrogen and about 5 percent by volume of nitrogen monoxide after forming the silicon nitride layer. The gas mixture was supplied at a flow rate of about 1 l/min into a chamber in which the heat treatment was performed. A nitrogen gas was supplied at a flow rate of about 0.95 l/min, and a nitrogen monoxide gas was supplied at a flow rate of about 0.05 l/min.

Tests were performed to ascertain high temperature stress (HTS) characteristics of the first, second, third and fourth non-volatile memory devices.

In example embodiments, programming operations of the first, second, third and fourth non-volatile memory devices were performed, and then threshold voltages of the first, second, third and fourth non-volatile memory devices were measured. Programming voltage of about 17.0V was applied for about 100 μs to each of the first, second, third and fourth non-volatile memory devices.

Programming and/or erasing operations of the first, second, third and fourth non-volatile memory devices were repeatedly performed about 1200 times. While performing the programming and/or erasing operations, a programming voltage of about 17.0V was repeatedly applied for about 100 μs, and an erasing voltage of about −19.0V was repeatedly applied for about 10 ms to each of the first, second, third and fourth non-volatile memory devices.

After performing the programming and/or erasing operations, baking processes on the first, second, third and fourth non-volatile memory devices were performed at a temperature of about 200° C. for about 2 hours. After performing the baking processes, threshold voltages of the first, second, third and fourth non-volatile memory devices were measured.

Figure 10:
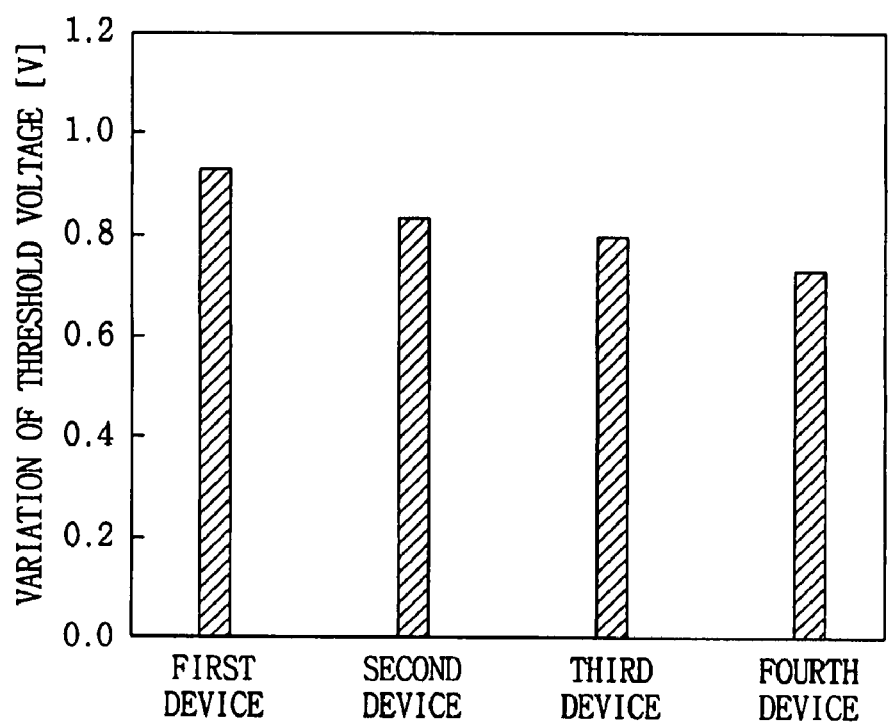
FIG. 10 is an example graph illustrating variations of threshold voltages of a first non-volatile memory device formed by a conventional method and second, third and fourth non-volatile memory devices formed by example embodiments.

FIG. 10 is an example graph illustrating variations of threshold voltages of a first non-volatile memory device formed by a conventional method and second, third and fourth non-volatile memory devices formed according to example embodiments.

As shown in FIG. 10, variations of the threshold voltages of the second, third and fourth non-volatile memory devices were reduced in comparison with the first non-volatile memory device. In example embodiments, a variation of the threshold voltage of the fourth non-volatile memory was smallest. It was understood that the variations of the threshold voltages of the non-volatile memory devices were influenced by the flow rate of the nitrogen monoxide gas. As a result, it was ascertained that the charge trapping layer may be desirably heat-treated using a gas mixture of about 95 to about 98 percent by volume of nitrogen and about 2 to about 5 percent by volume of nitrogen monoxide.

Threshold Voltage Window of Non-Volatile Memory Device

A fifth non-volatile memory device was manufactured according to example embodiments. The fifth non-volatile memory device was manufactured to include a silicon oxide layer having a thickness of about 40 Å as a tunnel insulating layer, a silicon nitride layer having a thickness of about 70 Å as a charge trapping layer, an aluminum oxide layer having a thickness of about 200 Å as a blocking layer, a tantalum nitride layer having a thickness of about 200 Å as a gate electrode, a tungsten nitride layer having a thickness of about 50 Å as an adhesion layer or a barrier layer, and a tungsten layer having a thickness of about 300 Å as a word line. In example embodiments, after forming the silicon nitride layer, a heat treatment, e.g., a rapid thermal annealing (RTA) process, was performed at a temperature of about 1200° C. for about 3 minutes. The heat treatment was performed under a gas atmosphere including nitrogen, and a partial pressure of oxygen in an RTA chamber was about $5 \times 10^{-6}$ Torr.

A programming voltage of about 17.0V was applied to the first non-volatile memory device, and thereafter a threshold voltage of the first non-volatile memory device was measured.

An erasing voltage of about −19.0V was applied to the first non-volatile memory device, and thereafter a threshold voltage of the first non-volatile memory device was measured.

A programming voltage of about 17.0V was applied to the fifth non-volatile memory device, and thereafter a threshold voltage of the fifth non-volatile memory device was measured.

An erasing voltage of about −19.0V was applied to the fifth non-volatile memory device, and thereafter a threshold voltage of the fifth non-volatile memory device was measured.

Figure 11:
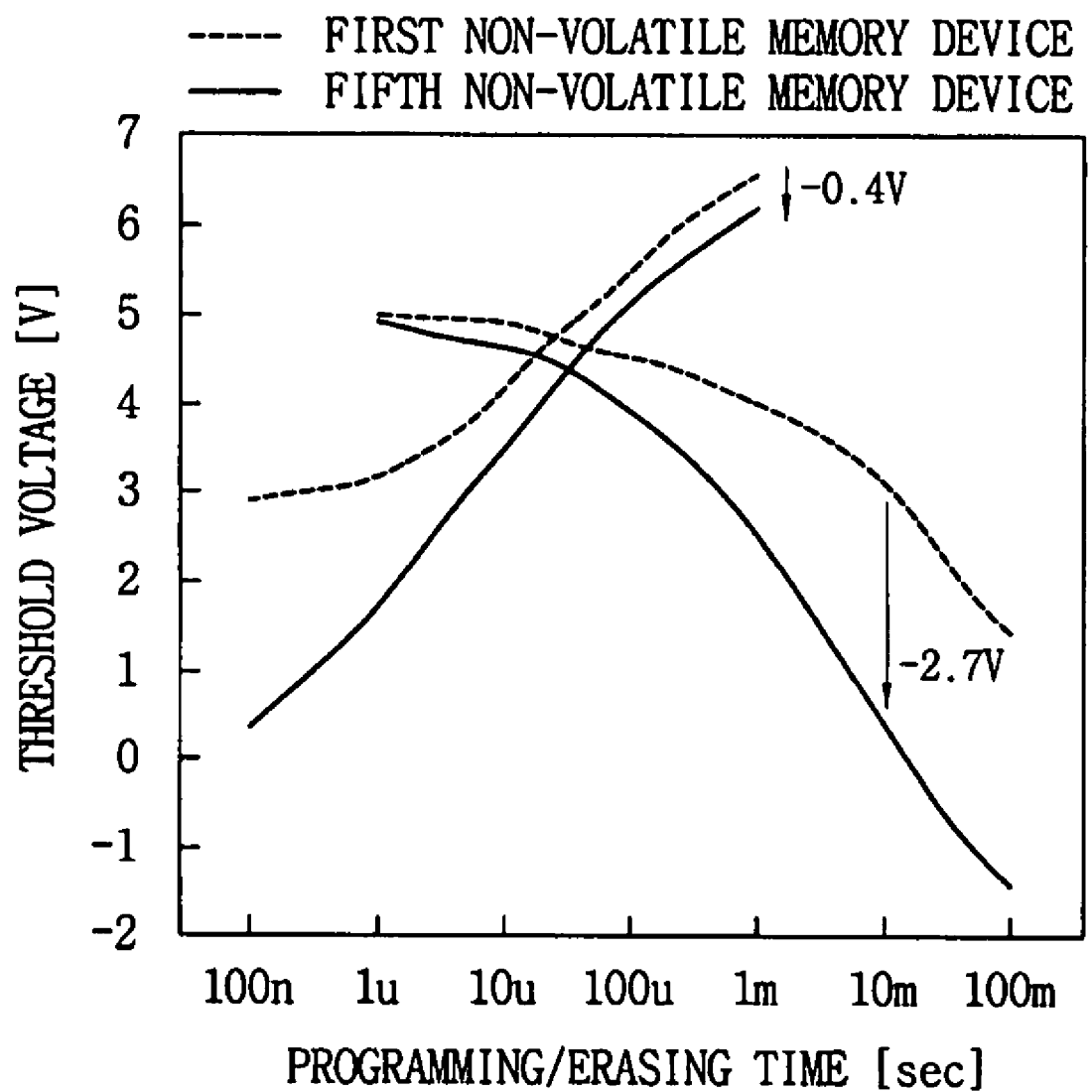
FIG. 11 is an example graph illustrating threshold voltages of a first non-volatile memory device formed by a conventional method and a fifth non-volatile memory device formed by an example embodiment.

FIG. 11 is an example graph illustrating threshold voltages of a first non-volatile memory device formed by a conventional method and a fifth non-volatile memory device formed according to example embodiments. In the example graph, the transverse axis represents the time required for completing a programming or an erasing operation.

Referring to FIG. 11, when applying the programming voltage for about 100 μs, the threshold voltage of the fifth non-volatile memory device was decreased by about 0.4V in comparison with that of the first non-volatile memory device.

Further, when applying the erasing voltage for about 10 ms, the threshold voltage of the fifth non-volatile memory device was decreased by about 2.7V in comparison with that of the first non-volatile memory device.

As a result, it was understood that the threshold voltage window of the fifth non-volatile memory device was improved by about 2.3V in comparison with that of the first non-volatile memory device.

According to example embodiments, a charge trapping layer of a non-volatile memory device may be sufficiently densified by a high temperature heat treatment. Thus, data retention performance and/or reliability of the non-volatile memory device may be improved.

In example embodiments, the charge trapping layer may be sufficiently densified by a heat treatment using a first gas including nitrogen and a second gas including oxygen, and a densified silicon oxynitride layer may be formed at a surface portion of the charge trapping layer. Alternatively, a heat treatment on the charge trapping layer may be performed under a gas atmosphere including nitrogen.

Defect sites in the charge trapping layer may be removed by the heat treatment. Because the charge trapping layer is sufficiently densified by the heat treatment, an unwanted material layer, such as a metal silicon oxynitride layer, may be prevented from being formed on the charge trapping layer while subsequently forming a blocking layer.

As a result, lateral charge diffusion may be prevented in the charge trapping layer, and/or a threshold voltage window of the non-volatile memory device may be improved.

Although example embodiments have been described, it is understood that the example embodiments should not be limited to these example embodiments, but various changes and modifications can be made by those skilled in the art within the spirit and scope of the example embodiments as hereinafter claimed.

What is claimed is:

1. A method of manufacturing a non-volatile memory device, comprising:
   forming a tunnel insulating layer on a channel region of a substrate;
   forming a charge trapping layer including silicon nitride on the tunnel insulating layer to trap electrons from the channel region;
   heat-treating the charge trapping layer using a first gas excluding oxygen and then using a second gas that includes oxygen to remove defect sites in the charge trapping layer and to densify the charge trapping layer for at least 60 minutes;
   forming a blocking layer on the heat-treated charge trapping layer;
   forming a conductive layer on the blocking layer; and
   patterning the conductive layer, the blocking layer, the heat-treated charge trapping layer and the tunnel insulating layer to form a gate structure on the channel region of the substrate.

2. The method of claim 1, wherein the charge trapping layer is heat-treated at a temperature of about 900° C. to about 1250° C.

3. The method of claim 1, wherein the charge trapping layer is heat-treated at a temperature above 1150° C.

4. The method of claim 1, wherein the blocking layer includes a metal oxide having a dielectric constant higher than that of the silicon nitride.

5. The method of claim 4, wherein the metal oxide includes at least one selected from the group consisting of hafnium (Hf), zirconium (Zr), tantalum (Ta), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu).

6. The method of claim 1, wherein the blocking layer includes a metal silicon oxide.

7. The method of claim 1, wherein the first gas includes at least one of nitrogen ($N_2$) and ammonia ($NH_3$).

8. The method of claim 1, wherein the second gas includes at least one selected from the group consisting of oxygen ($O_2$), ozone ($O_3$) and nitrogen monoxide (NO).

9. The method of claim 1, wherein a densified silicon oxynitride layer is formed at a surface portion of the charge trapping layer by the heat-treating of the charge trapping layer.

10. The method of claim 1, wherein forming the gate structure includes:
    patterning the conductive layer to form a gate electrode structure; and
    patterning the blocking layer, the heat-treated charge trapping layer and the tunnel insulating layer to form a blocking layer pattern, a charge trapping layer pattern and a tunnel insulating layer pattern.

11. The method of claim 10, further comprising forming spacers on side surfaces of the gate electrode structure, wherein the blocking layer, and the heat-treated charge trapping layer and the tunnel insulating layer are patterned by an etching process using the spacers as an etch mask.

12. The method of claim 1, further comprising forming source/drain regions at surface portions of the substrate adjacent to the gate structure after forming the gate structure.

13. A method of manufacturing a non-volatile memory device, comprising:
    forming a tunnel insulating layer on a channel region of a substrate;
    forming a charge trapping layer including silicon nitride on the tunnel insulating layer to trap electrons from the channel region;
    heat-treating the charge trapping layer, using a first gas excluding oxygen and then using a second gas that includes oxygen, at a temperature of about 900° C. to about 1250° C. to densify the charge trapping layer for at least 60 minutes;
    forming a blocking layer on the heat-treated charge trapping layer;
    forming a conductive layer on the blocking layer; and
    patterning the conductive layer, the blocking layer, the heat-treated charge trapping layer and the tunnel insulating layer to form a gate structure on the channel region of the substrate.

14. The method of claim 13, wherein the blocking layer includes at least one of a silicon oxide and a metal oxide having a dielectric constant higher than that of the silicon nitride.

15. The method of claim 13, wherein the blocking layer includes a metal silicon oxide.

* * * * *